United States Patent
Chen et al.

(10) Patent No.: US 10,778,244 B2
(45) Date of Patent: Sep. 15, 2020

(54) CORRECTION METHOD AND CORRECTION CIRCUIT FOR SIGMA-DELTA MODULATOR

(71) Applicant: REALTEK SEMICONDUCTOR CORPORATION, Hsinchu (TW)

(72) Inventors: Chih-Lung Chen, Hsinchu County (TW); Jie-Fan Lai, Hsinchu (TW); Yu-Chang Chen, New Taipei (TW); Shih-Hsiung Huang, Miaoli County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/519,103

(22) Filed: Jul. 23, 2019

(65) Prior Publication Data
US 2020/0106456 A1    Apr. 2, 2020

(30) Foreign Application Priority Data
Sep. 27, 2018  (TW) ............... 107134096 A

(51) Int. Cl.
*H03M 1/06*    (2006.01)
*H03M 3/00*    (2006.01)
*H03M 1/12*    (2006.01)
*H03M 1/10*    (2006.01)

(52) U.S. Cl.
CPC .......... *H03M 3/322* (2013.01); *H03M 3/32* (2013.01); *H03M 3/352* (2013.01); *H03M 3/458* (2013.01); *H03M 3/50* (2013.01); *H03M 1/06* (2013.01); *H03M 1/10* (2013.01); *H03M 1/12* (2013.01); *H03M 3/30* (2013.01)

(58) Field of Classification Search
CPC ............ H03M 1/06; H03M 3/30; H03M 1/12; H03M 1/10
USPC .................. 341/118, 143, 155, 120
See application file for complete search history.

(56) References Cited

U.S. PATENT DOCUMENTS 7,486,214 B1 *  2/2009  Di Giandomenico ...................... H03M 3/386 327/552
2017/0033801 A1 *  2/2017  Lo ......................... H03M 3/422

OTHER PUBLICATIONS

Shanthi Pavan, IEEE paper."Continuous-Time Delta-Sigma Modulator Design Using the Method of Moments", Jun. 2014, pp. 1629-1637, vol. 61, No. 6 ,IEEE Transactions on Circuits and Systems.

* cited by examiner

*Primary Examiner* — Joseph J Lauture
(74) *Attorney, Agent, or Firm* — WPAT, PC

(57) ABSTRACT

A correction method and a correction circuit for a sigma-delta modulator (SDM) are provided. The SDM includes a loop filter, a quantizer, and a digital-to-analog converter (DAC). The correction method includes the following steps: controlling the DAC not to receive the output of the quantizer; controlling the SDM to stop receiving signals; inputting a test signal to the DAC; converting the output of the loop filter to a digital signal; comparing the digital signal with a preset value; and adjusting the loop filter according to the result of comparing the digital signal and the preset value.

8 Claims, 8 Drawing Sheets

US 10,778,244 B2

CORRECTION METHOD AND CORRECTION CIRCUIT FOR SIGMA-DELTA MODULATOR

BACKGROUND

1. Field of the Disclosure

This disclosure generally relates to sigma-delta modulators (SDMs), and, more particularly, to a correction method and a correction circuit for SDMs.

2. Description of Related Art

A sigma-delta modulator (SDM) can be used as an analog-to-digital converter (ADC). However, because the SDM is susceptible to manufacturing process, voltage and temperature (PVT), the ADC may suffer resolution degradation or even error. Therefore, a correction method and a correction circuit are needed to correct the SDM to ensure the efficiency and correctness of the SDM.

SUMMARY

In view of the issues of the prior art, an object of this disclosure is to provide a correction method and a correction circuit for sigma-delta modulators (SDMs) to make SDMs less susceptible to or free from negative influences of manufacturing process, voltage and temperature (PVT).

A correction method for correcting an SDM is provided. The SDM includes a loop filter, a quantizer, and a digital-to-analog converter (DAC). The correction method includes: controlling the DAC not to receive an output of the quantizer; controlling the SDM to stop receiving signals; inputting a test signal to the DAC; converting an output of the loop filter into a digital signal; comparing the digital signal with a preset value; and adjusting the loop filter according to a result of comparing the digital signal with the preset value.

A correction circuit for correcting an SDM is provided. The SDM includes a loop filter, a quantizer, and a DAC. The correction circuit includes a memory, a control circuit, and an analog-to-digital converter (ADC). The memory stores multiple program instructions and a preset value. The control circuit is coupled to the memory and configured to execute the program instructions to correct the SDM. The ADC is coupled between the loop filter and the control circuit. The process of correcting the SDM includes the following steps: controlling the DAC not to receive an output of the quantizer; controlling the SDM to stop receiving signals; inputting a test signal to the DAC; the ADC converting an output of the loop filter into a digital signal; comparing the digital signal with the preset value; and adjusting the loop filter according to a result of comparing the digital signal with the preset value.

The correction method and correction circuit for an SDM of this disclosure can correct the SDM when the chip has just been manufactured or before the circuit is in operation. Compared with the prior art, the present disclosure can make the practical circuit (the continuous-time SDM) and the simulated or designed circuit (the discrete-time SDM) have similar or even substantially the same performance, and instant corrections for the current operating environment may significantly reduce the negative impacts by PVT on the SDM.

These and other objectives of this disclosure no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes correction methods and correction circuits for correcting sigma-delta modulators (SDMs) to make SDMs less susceptible to or free from negative influences of manufacturing process, voltage and temperature (PVT). On account of that some or all elements of the correction circuits for correcting SDMs could be known, the detail of such elements is omitted provided that such detail has little to do with the features of this disclosure and this omission nowhere dissatisfies the specification and enablement requirements. Some or all of the processes of the correction methods for correcting SDMs may be implemented by software and/or firmware, and can be performed by the correction circuits or their equivalents. A person having ordinary skill in the art can choose components or steps equivalent to those described in this specification to carry out this disclosure, which means that the scope of this disclosure is not limited to the embodiments in the specification.

Figure 1:
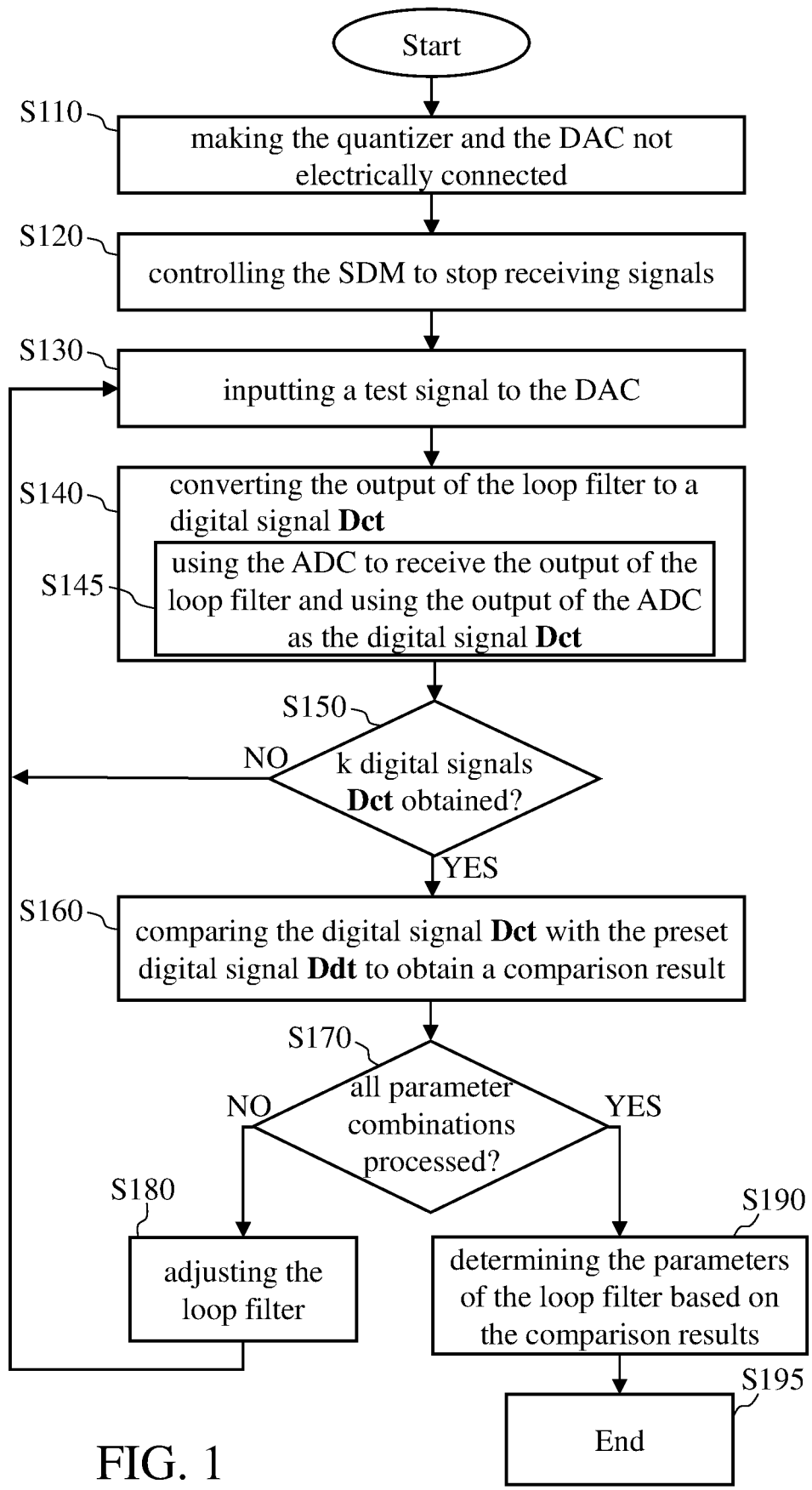
FIG. 1 illustrates a flow chart of a correction method for correcting a sigma-delta modulator (SDM) according to an embodiment of this disclosure.
Figure 2:
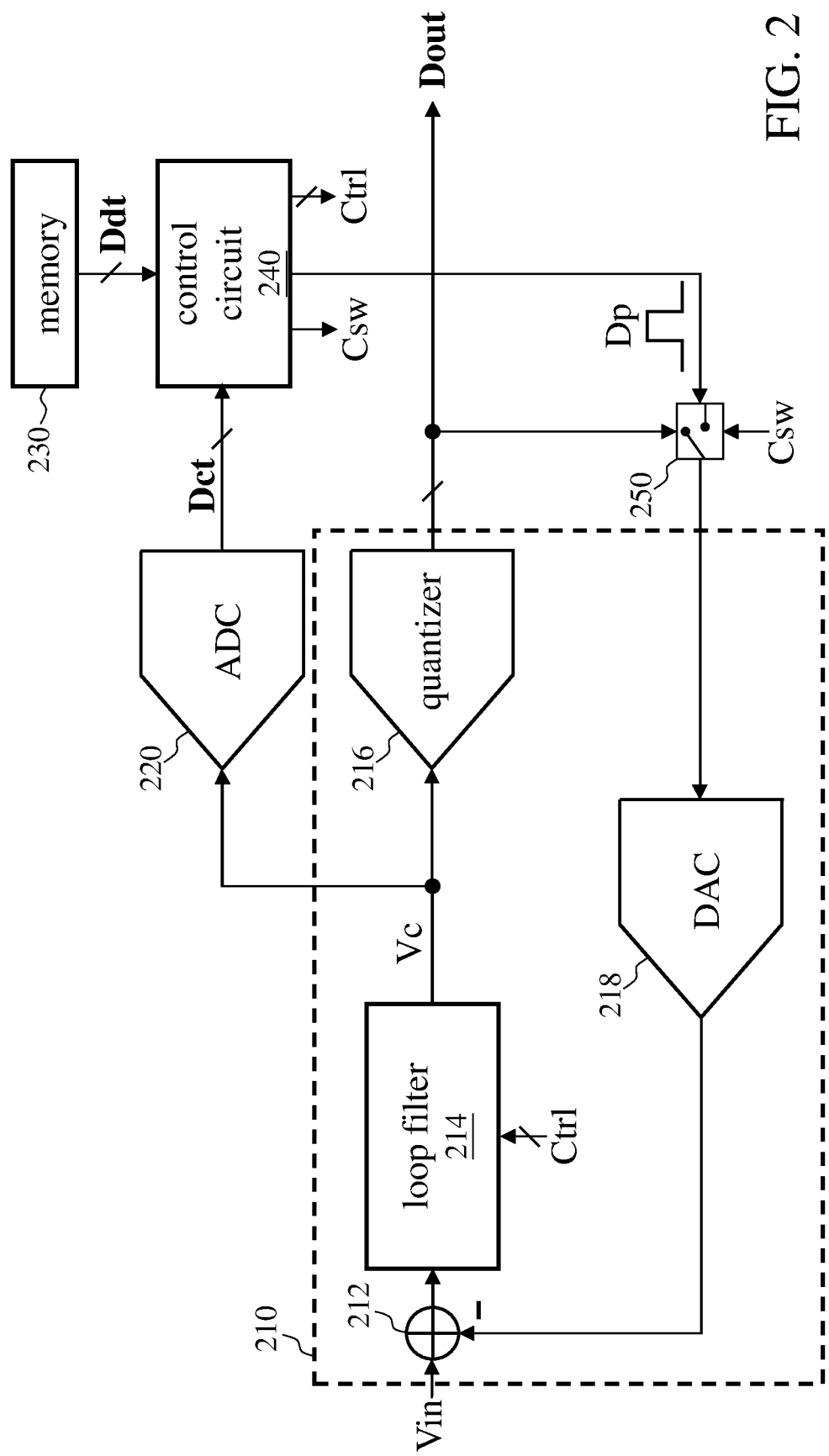
FIG. 2 illustrates a functional block diagram of the correction circuit for correcting an SDM according to an embodiment of this disclosure.

FIG. 1 is a flow chart of a correction method for correcting an SDM according to one embodiment of this disclosure, and FIG. 2 is a functional block diagram of a correction circuit for correcting an SDM according to one embodiment of this disclosure. The correction circuit includes an analog-to-digital converter (ADC) 220, a memory 230, a control circuit 240, and a switch 250. The control circuit 240 can be a circuit that is capable of executing program codes or program instructions, such as a central processing unit (CPU), a microcontroller, a microprocessor, a digital signal processor (DSP), and the like. The memory 230 stores a plurality of program codes or program instructions, and the control circuit 240 executes the program codes or program instructions to correct the SDM 210. The SDM 210 includes an adder circuit 212, a loop filter 214, a quantizer 216, and a digital-to-analog converter (DAC) 218. Reference is made to both FIG. 1 and FIG. 2 for the following description.

When the correction process starts, the control circuit 240 issues the control signal Csw to control the switch 250, such that the quantizer 216 and the DAC 218 are not electrically connected to each other (step S110). Step S110 aims primarily to break the connection between the quantizer 216 and the DAC 218—namely, to disconnect the quantizer 216 from the DAC 218. In other words, the control circuit 240 causes the DAC 218 not to receive or temporarily not to receive the output Dout of the quantizer 216 by controlling the switch 250. The output Dout of the quantizer 216 is also the output of the SDM 210.

Next, the control circuit 240 controls the SDM 210 to stop receiving signals (step S120), for example, by controlling the input signal Vin to be 0 or by controlling the adder circuit 212 to temporarily receive only the output signal of the DAC 218.

Next, the control circuit 240 inputs the test signal Dp to the DAC 218 (step S130). The test signal Dp is processed by the DAC 218, the adder circuit 212, and the loop filter 214, and the loop filter 214 outputs the signal Vc accordingly. In some embodiments, the test signal Dp can be a digital pulse.

Next, the output signal Vc of the loop filter 214 is converted into the digital signal Dct (step S140). More specifically, this disclosure utilizes an additional ADC 220 (which is not a component of the SDM 210) to receive the output signal Vc of the loop filter 214, and utilizes the output of the ADC 220 as the digital signal Dct (step S145). In some embodiments, the ADC 220 is a component of a system or circuit, other than the SDM 210, in the chip in which the SDM 210 is fabricated. The system or circuit may be, for example, part of a Long Term Evolution (LTE) transceiver. When the receiving or transmitting circuit of the LTE transceiver is idle, the control circuit 240 can utilize the ADC of the idle receiving or transmitting circuit as the ADC 220. After obtaining the digital signal Dct, the control circuit 240 can store the digital signal Dct in its own memory circuit (e.g., a register) or store it in the memory 230. In some embodiments, the resolution of the ADC 220 is greater than the resolution of the quantizer 216. The use of the ADC 220 with higher resolution to convert the signal Vc can improve the correctness of the correction.

Next, the control circuit 240 determines whether k digital signals Dct are obtained, k being a positive integer (step S150). If not (NO branch), the control circuit 240 repeatedly performs steps S130 to S145 until k digital signals Dct are obtained; if so (YES branch), the flow proceeds to step S160.

Figure 3A:
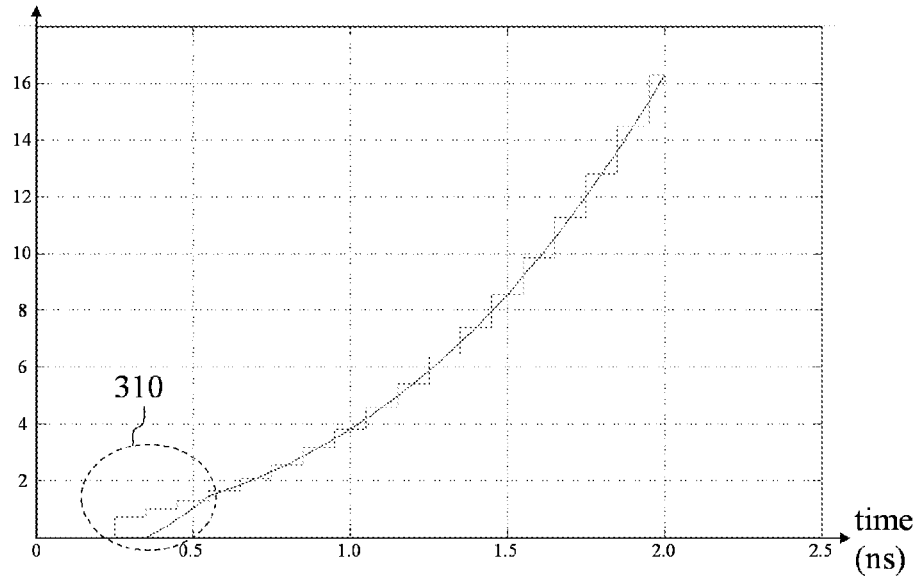
FIGS. 3A and 3B illustrate the digital signal Dct and the preset digital signal Ddt with respect to time.
Figure 3B:
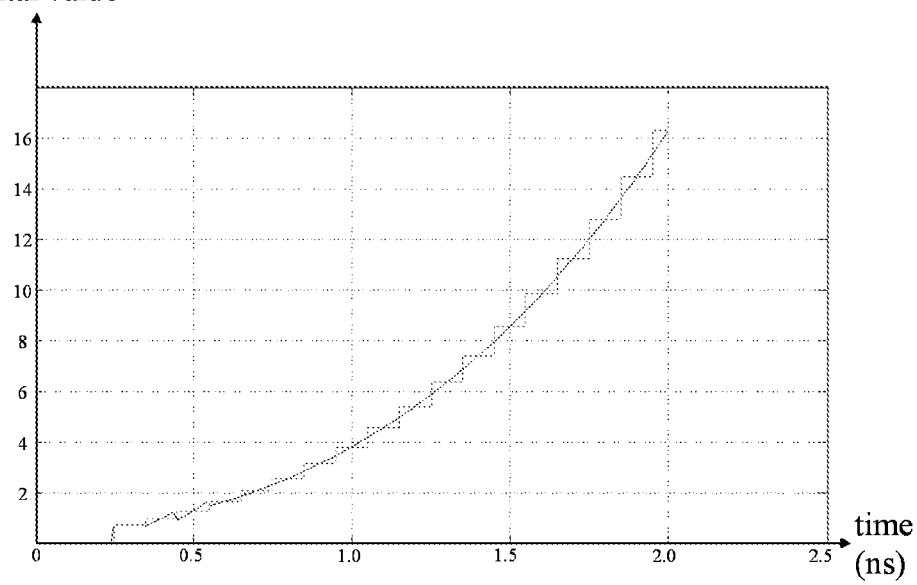

Next, the control circuit 240 compares the digital signal(s) Dct with preset digital signal(s) Ddt, and a comparison result is obtained accordingly (step S160). In some embodiments, the number of preset digital signals Ddt is k by default (k being a positive integer and adjustable), and the control circuit 240 calculates a least mean square (LMS) of the differences between the k digital signals Dct and the k preset digital signals Ddt. FIGS. 3A and 3B show the digital signal Dct and the preset digital signal Ddt with respect to time. In FIGS. 3A and 3B, the preset digital signal Ddt is represented by the discontinuous (or jagged) line, and the digital signal Dct is represented by the continuous line. The preset digital signal Ddt can be regarded as an ideal output value of the SDM 210. A smaller LMS indicates that the continuous line and the discontinuous line approximate each other—namely, the output of the SDM 210 is closer to the ideal value, which means that the SDM 210 functions more similarly to the originally designed circuit. After obtaining the comparison result (e.g., the LMS) in step S160, the control circuit 240 may store the comparison result in its own memory circuit (e.g., a register) or in the memory 230.

Next, the control circuit 240 determines whether all parameter combinations of the loop filter 214 have been processed (step S170). If not (NO branch), the flow proceeds to step S180; if so (YES branch), the flow proceeds to step S190.

Figure 4:
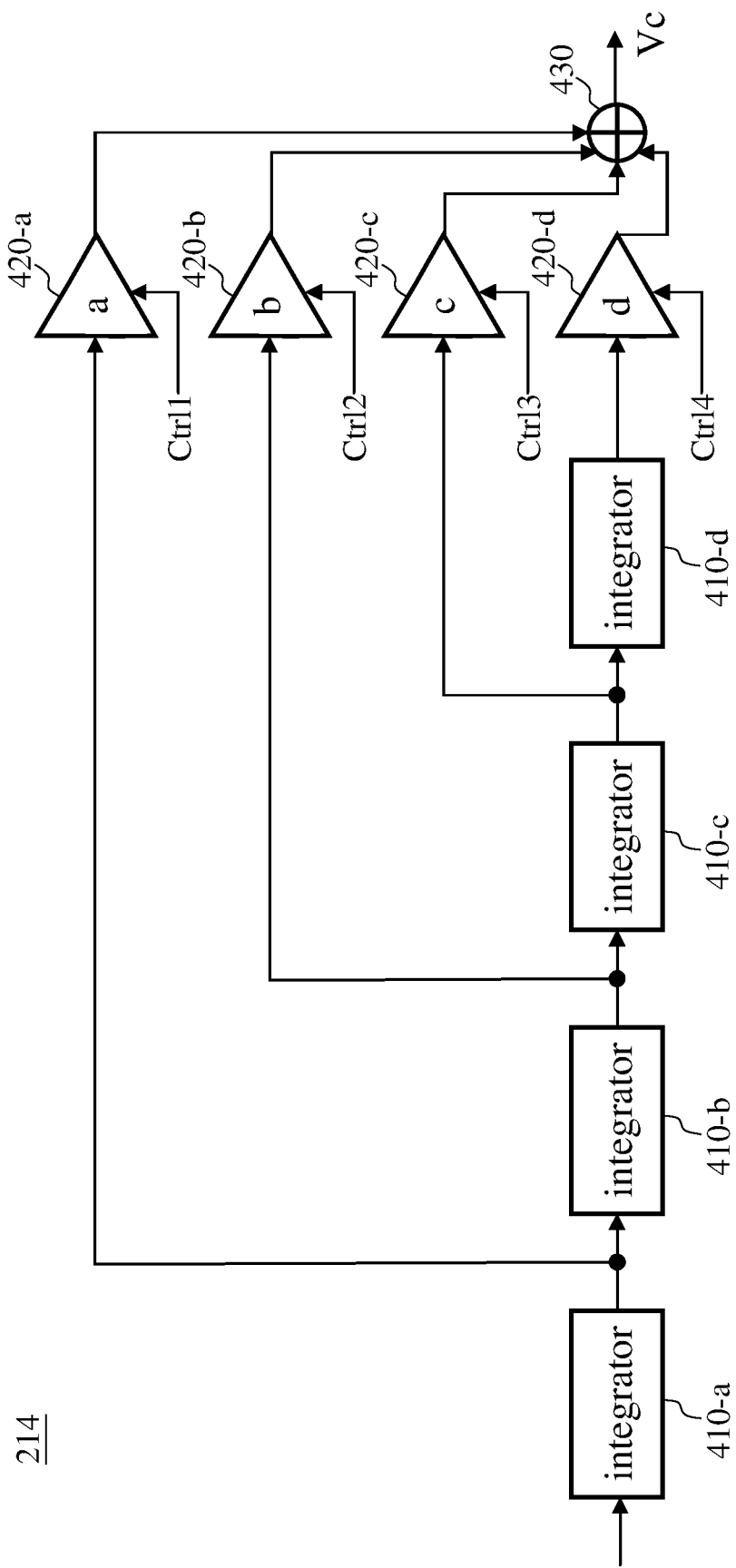
FIG. 4 illustrates a circuit diagram of a loop filter according to one embodiment of this disclosure.

FIG. 4 illustrates a circuit diagram of the loop filter 214 according to one embodiment of this disclosure. The loop filter 214 is a fourth-order loop filter including four integrators 410 (410-a to 410-d), four amplifiers 420 (420-a to 420-d), and an adder circuit 430. The operation principles of the loop filter of FIG. 4 are well known to people having ordinary skill in the art and are omitted for brevity. In some embodiments, the magnifications of the amplifiers 420-a, 420-b, 420-c, and 420-d (denoted by a, b, c, and d, respectively) are respectively controlled by the control signals Ctrl1 to Ctrl4 (collectively, the control signal Ctrl of FIG. 2) generated by the control circuit 240. If the magnifications a, b, c, and d each have five choices, then the loop filter 214 has $5^4=625$ parameter combinations. In some embodiments, the resistor(s) and capacitor(s) of the integrators 410-a, 410-b, 410-c, and 410-d may also be utilized as parameters for adjusting the loop filter 214. In some embodiments, the control circuit 240 employs the exhaustive method to enumerate all parameter combinations, but this disclosure is not limited to the exhaustive method. The following description uses the exhaustive method as an example.

Reference is made to FIG. 1. When step S170 is NO, the control circuit 240 adjusts the loop filter 214 in step S180 by selecting the unprocessed parameter combination of the loop filter 214. After the adjustment, the control circuit 240 performs steps S130 to S170 again.

When step S170 is YES, the control circuit 240 has generated the comparison result for each parameter combination. Next, in step S190, the control circuit 240 determines the parameters of the loop filter 214 based on all comparison results. More specifically, in cases where the LMS of the differences between the k digital signals Dct and the k preset digital signals Ddt is used as the comparison result in step S160, the control circuit 240 in step S190 selects the parameter combination corresponding to the smallest comparison result to be used as the parameters of the loop filter 214. After the parameters of the loop filter 214 are determined, the control circuit 240 ends the correction process of the SDM 210 by controlling the switch 250, such that the quantizer 216 is electrically connected with the DAC 218 (step S195).

As shown in FIG. 3A or 3B, after the correction is completed, the output of the SDM 210 is relatively close to the ideal value. The discontinuous line of FIG. 3A or 3B (i.e., the preset digital signal Ddt) may be, for example, a simulation or calculation result of a discrete-time SDM. More specifically, in the design of the SDM 210, a software tool can be used to create the discrete-time SDM that is a similar to or substantially the same as the SDM 210 in circuit configuration, and the quantizer and the DAC of the discrete-time SDM are also disconnected (corresponding to step 110) before a test signal is inputted to the DAC. Then, the digital value of the output of the loop filter is taken as the preset digital signal Ddt. The preset digital signal Ddt is the ideal output of the practical SDM 210 (i.e., the continuous-time SDM) when the same test signal is inputted to the SDM 210. In other words, despite the fact that the SDM 210 may be affected by PVT during practical operations, if the SDM 210 is corrected according to the flow of FIG. 1 when the chip has just been made or each time before the SDM 210 is in operation, then the SDM 210 will function in substantially the same way as the designed circuit. The corrected SDM 210 and the discrete-time SDM have similar noise transfer functions (NTFs), that is, NFTc(s)≅NTFd(z), NFTc(s) being the NTF of the SDM 210, and NTFd(z) being the NTF of the discrete-time SDM. NFTc(s)=1/(1+DACc(s)*Hc(s)), and NFTd(z)=1/(1+DACd(z)*Hd(z)), where DACc(s) is the transfer function of the DAC 218, Hc(s) is the transfer function of the loop filter 214, DACd(z) is the transfer function of the discrete-time DAC, and Hd(z) is the transfer function of the discrete-time loop filter.

The magnification of the loop filter 214 can be adjusted by adjusting the ratio of the resistors. More specifically, in some embodiments, the adder circuit 430 and the amplifiers 420 can be a combination of an operational amplifier and a plurality of resistors, and the magnification can be adjusted by adjusting the ratio of the resistors. Employing the operational amplifier and resistors to implement the amplifiers 420 and the adder circuit 430 is well known to people having ordinary skill in the art and is omitted for brevity.

It can be seen from FIG. 3A that after the correction method of FIG. 1 is completed, the output value of the SDM 210 in the first several operation cycles (as indicated by the circle 310) may still be different from the ideal value. This is because the integrator 410 in the loop filter 214 causes signal delay. However, in cases where the loop filter 214 has small signal delay or few stages, the SDM 210, after being corrected according to the correction procedure of FIG. 1, can overcome the PVT influences within the first several operation cycles.

Figure 5:
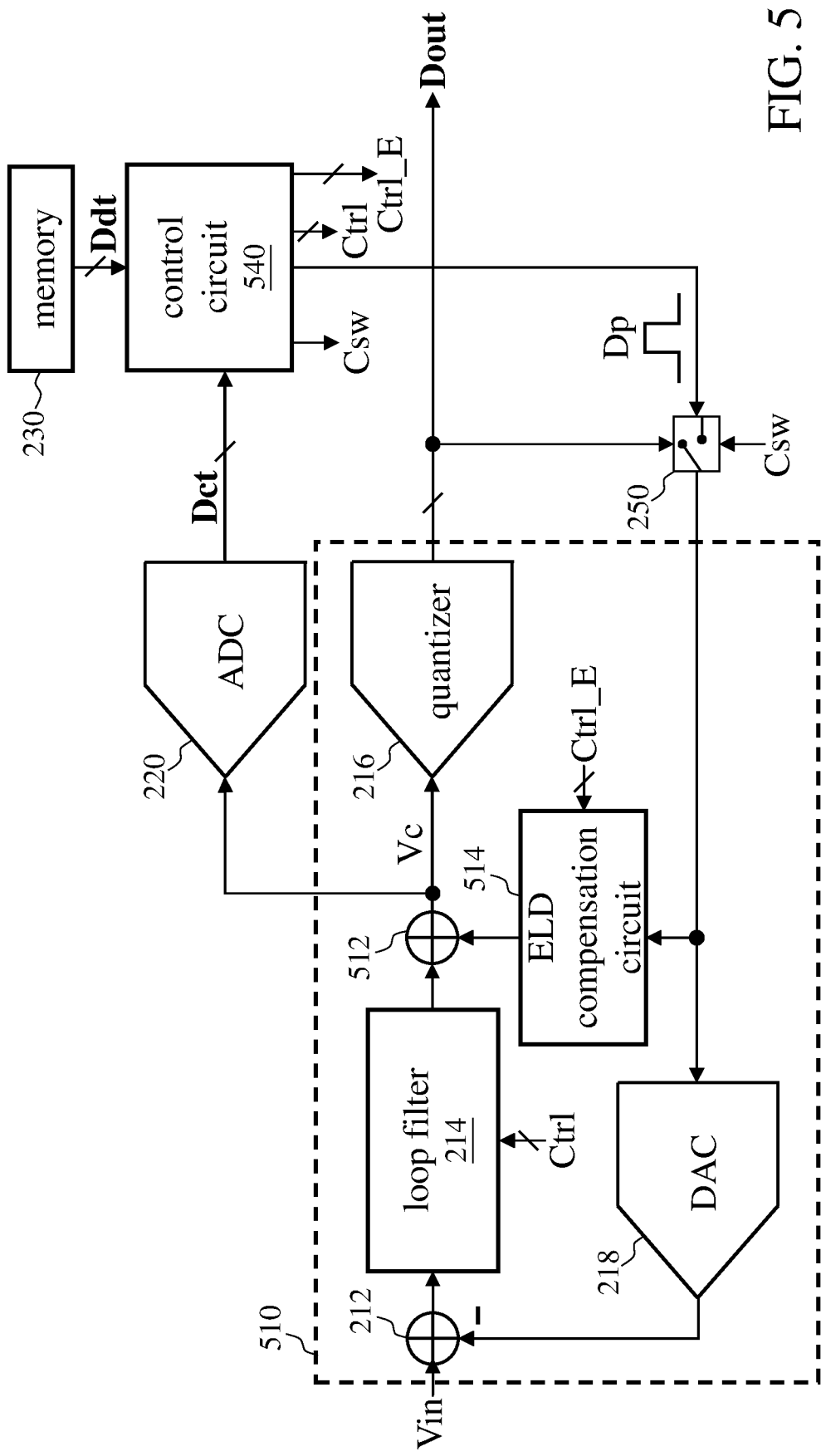
FIG. 5 illustrates a functional block diagram of the correction circuit for correcting an SDM according to another embodiment of this disclosure.
Figure 6:
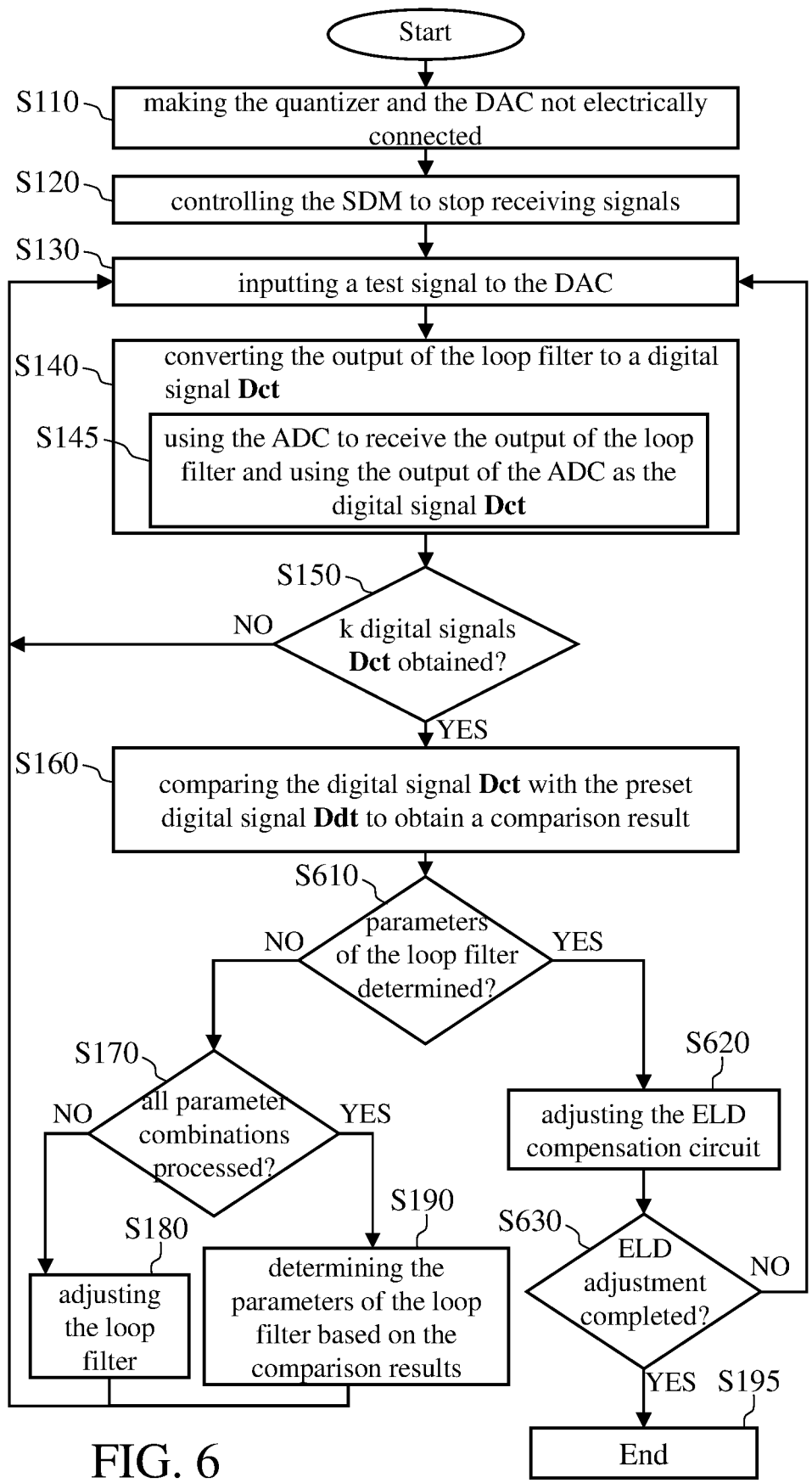
FIG. 6 illustrates a flow chart of a correction method for correcting an SDM according to another embodiment of this disclosure.

In some circuits, in order to overcome the signal delay caused by the loop filter 214, an SDM is usually provided with an excess loop delay (ELD) compensation circuit, and the SDM 510 of FIG. 5 is an embodiment of this circuit. The SDM 510 is similar to the SDM 210, except that the SDM 510 further includes an adder circuit 512 and an ELD compensation circuit 514. This disclosure also provides a correction method and a corresponding correction circuit for the SDM that is provided with the ELD compensation circuit. FIG. 5 is a functional block diagram of a correction circuit for an SDM according to another embodiment, and FIG. 6 is a flow chart of a correction method for correcting an SDM according to another embodiment of this disclosure. The correction circuit includes the ADC 220, the memory 230, the control circuit 540, and the switch 250. The control circuit 540 may be a circuit having program execution capabilities, such as a CPU, a microcontroller, a microprocessor, a DSP, or the like. The memory 230 stores a plurality of program codes or program instructions, and the control circuit 540 executes the program codes or program instructions to correct the SDM 510. Reference is made to both FIG. 5 and FIG. 6 for the following descriptions.

The correction flow of FIG. 6 is similar to that of FIG. 1. Before the parameters of the loop filter 214 are determined (step S610 being NO), the control circuit 540 performs steps S110 to S190 to determine the parameters of the loop filter 214. After the parameters of the loop filter 214 are determined (step S610 being YES), the control circuit 540 adjusts the ELD compensation circuit 514 (steps S620 and S630).

Figure 7:
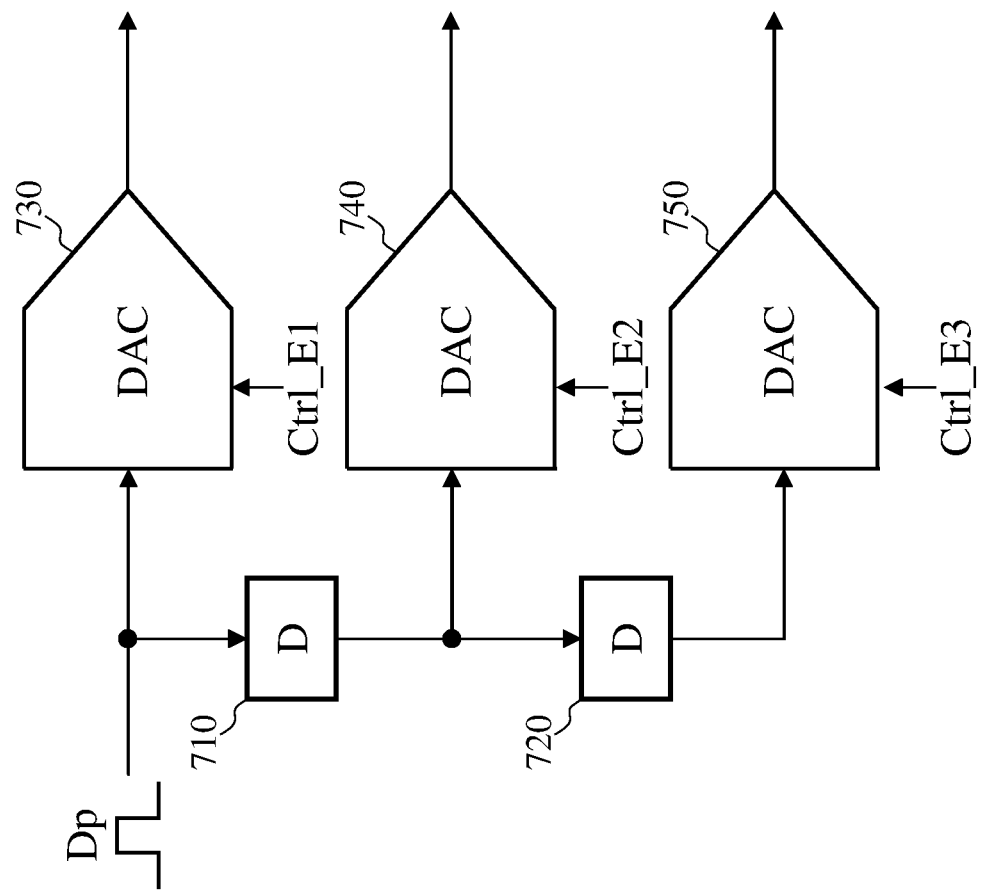
FIG. 7 illustrates a circuit diagram of an excess loop delay (ELD) compensation circuit according to one embodiment of this disclosure.

FIG. 7 is a circuit diagram of an ELD compensation circuit 514 according to one embodiment. The ELD compensation circuit 514 includes a delay circuit 710, a delay circuit 720, and DACs 730, 740 and 750. The operation principles of the ELD compensation circuit 514 are well known to people having ordinary skill in the art and are omitted for brevity. The DACs 730, 740 and 750 are respectively controlled by the control signals Ctrl_E1, Ctrl_E2 and Ctrl_E3 (collectively, the control signal Ctrl_E of FIG. 5). The control circuit 540 adjusts the currents of the DACs 730 to 750 in step S620. More specifically, taking the ELD compensation circuit 514 of FIG. 7 as an example, the control circuit 540 performs step S620 three times before step S630 is determined to be YES: adjusting the DAC 730 for the first time, adjusting the DAC 740 for the second time, and adjusting the DAC 750 for the third time. When the digital signal Dct is smaller than the preset digital signal Ddt (as indicated by the circle 310 of FIG. 3A), the currents of the DACs 730, 740 and 750 should be increased. On the contrary, when the digital signal Dct is greater than the preset digital signal Ddt, the currents of the DACs 730, 740 and 750 should be decreased. The means for adjusting the current of the DAC is well known to people having ordinary skill in the art and is omitted for brevity.

When the correction procedure of FIG. 6 is completed, the behavior of the SDM 510 becomes more identical to the originally designed circuit (which means that the corrected circuit has overcome the PVT influences), and the SDM 510 is also corrected for the first several operation cycles.

Figure 8:
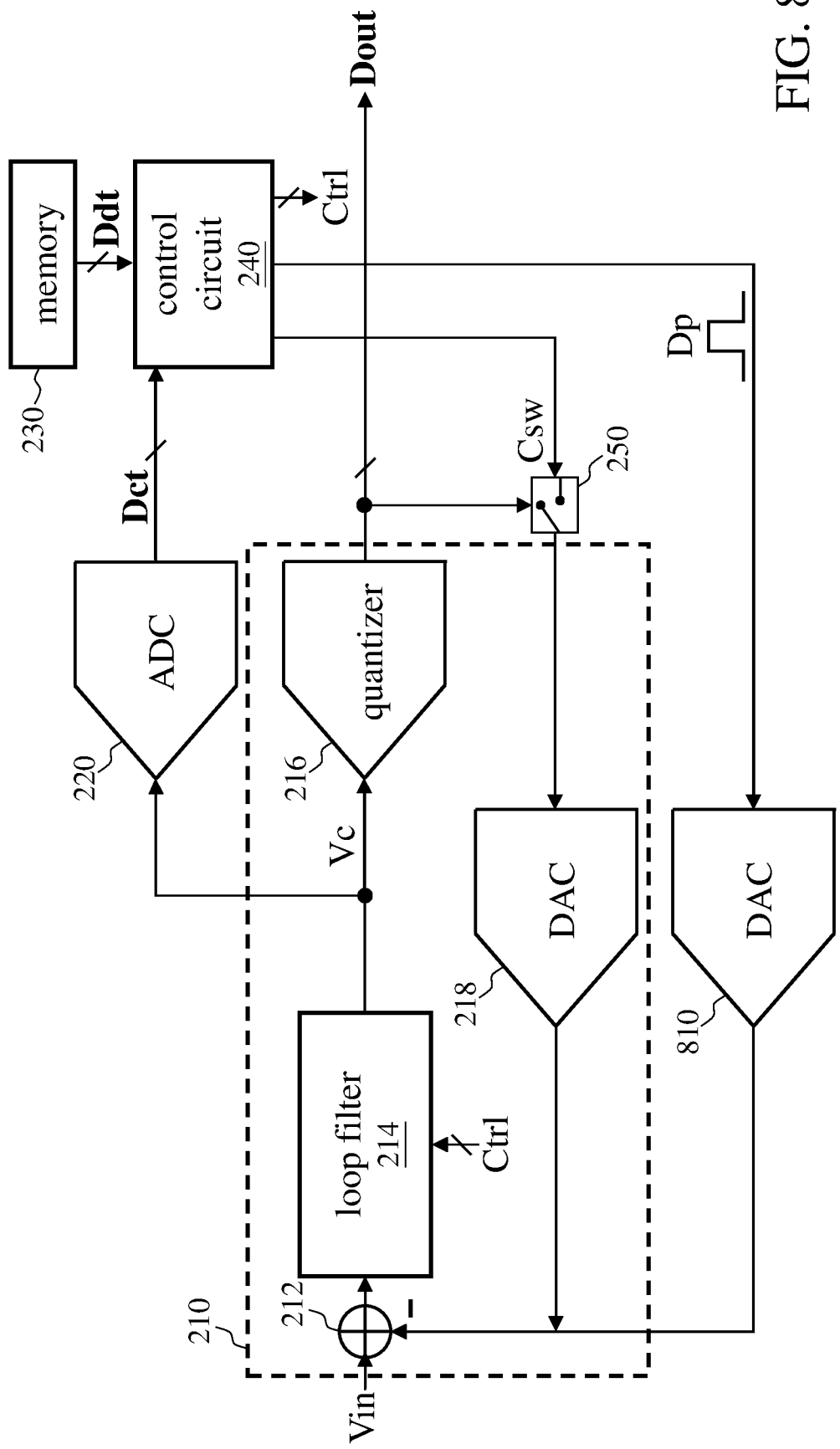
FIG. 8 illustrates a functional block diagram of the correction circuit for correcting an SDM according to another embodiment of this disclosure.

FIG. 8 is a functional block diagram of the correction circuit for the SDM according to another embodiment of this disclosure. The correction circuit of FIG. 8 is similar to the correction circuit of FIG. 2, except that the correction circuit of FIG. 8 further includes a DAC 810 coupled between the control circuit 240 and the adder circuit 212. In the embodiment of FIG. 8, the control circuit 240 outputs test signal Dp to the DAC 810 instead of the DAC 218, and the DAC 218 is not active or functioning during the correction process. The DAC 810 can be designed to have a smaller current than the DAC 218, in order to avoid causing the loop filter 214 to saturate or overload during correction.

In some embodiments, the current of the DAC 218 or DAC 810 can be further reduced during correction to further prevent the loop filter 214 from saturating or overloading. The correction method of this disclosure can also use simultaneous equations to find the parameter combination of the loop filter 214. When the correction method of this disclosure is being performed, the SDM 210 or the SDM 510 can be operated at full speed or at a reduced speed.

Since a person having ordinary skill in the art can appreciate the implementation detail and the modification thereto of the present method embodiment through the disclosure of the device embodiment, repeated and redundant description is thus omitted. Please note that there is no step sequence limitation for the method embodiments as long as the execution of each step is applicable. Furthermore, the shape, size, and ratio of any element and the step sequence of any flow chart in the disclosed figures are exemplary for understanding, not for limiting the scope of this disclosure.

The aforementioned descriptions represent merely the preferred embodiments of this disclosure, without any intention to limit the scope of this disclosure thereto. Various equivalent changes, alterations, or modifications based on the claims of this disclosure are all consequently viewed as being embraced by the scope of this disclosure.

What is claimed is:

1. A correction method for correcting a sigma-delta modulator (SDM), the SDM comprising a loop filter, a quantizer, and a digital-to-analog converter (DAC), the correction method comprising:
controlling the DAC not to receive an output of the quantizer;
controlling the SDM to stop receiving signals;
inputting a test signal to the DAC;
using an analog-to-digital converter (ADC) to convert an output of the loop filter into a digital signal;
comparing the digital signal with a preset value; and
adjusting the loop filter according to a result of comparing the digital signal with the preset value.

2. The correction method of claim 1, wherein the SDM further comprises an excess loop delay (ELD) compensation circuit, the correction method further comprising:
adjusting the ELD compensation circuit according to the result of comparing the digital signal with the preset value.

3. The correction method of claim 1, wherein the step of adjusting the loop filter according to the result of comparing the digital signal with the preset value adjusts a parameter of the loop filter.

4. The correction method of claim 1, wherein the ADC is not a component of the SDM.

5. A correction circuit for correcting a sigma-delta modulator (SDM), the SDM comprising a loop filter, a quantizer, and a digital-to-analog converter (DAC), the correction circuit comprising:
a memory storing a plurality of program instructions and a preset value;
a control circuit coupled to the memory and configured to execute the program instructions to correct the SDM; and
an analog-to-digital converter (ADC) coupled between the loop filter and the control circuit;
wherein a process of correcting the SDM comprises following steps:
controlling the DAC not to receive an output of the quantizer;
controlling the SDM to stop receiving signals;
inputting a test signal to the DAC;
the ADC converting an output of the loop filter into a digital signal;
comparing the digital signal with the preset value; and
adjusting the loop filter according to a result of comparing the digital signal with the preset value.

6. The correction circuit of claim 5, wherein the SDM further comprises an excess loop delay (ELD) compensation circuit, and the process of correcting the SDM further comprises:
adjusting the ELD compensation circuit according to the result of comparing the digital signal with the preset value.

7. The correction circuit of claim 5, wherein the step of adjusting the loop filter according to the result of comparing the digital signal with the preset value adjusts a parameter of the loop filter.

8. The correction circuit of claim 5, wherein the ADC is not a component of the SDM.

* * * * *